United States Patent
Ono et al.

(10) Patent No.: US 7,071,675 B2
(45) Date of Patent: Jul. 4, 2006

(54) BAND DISTRIBUTION INSPECTING DEVICE AND BAND DISTRIBUTION INSPECTING METHOD

(75) Inventors: Yasukazu Ono, Kasugai (JP); Koji Okada, Kasugai (JP); Hiroyuki Matsunami, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 106 days.

(21) Appl. No.: 10/792,810

(22) Filed: Mar. 5, 2004

(65) Prior Publication Data
US 2005/0057241 A1    Mar. 17, 2005

(30) Foreign Application Priority Data
Sep. 11, 2003    (JP) .............................. 2003-319243

(51) Int. Cl.
G01R 23/00    (2006.01)
G01R 13/00    (2006.01)

(52) U.S. Cl. ...................... 324/76.19; 702/66; 702/190
(58) Field of Classification Search ............. 324/76.19; 702/66, 190
See application file for complete search history.

(56) References Cited

U.S. PATENT DOCUMENTS

| | | | |
|---|---|---|---|
| 4,339,711 A * | 7/1982 | Inami et al. ............. | 324/76.19 |
| 4,973,897 A * | 11/1990 | Ohsawa .................... | 324/76.19 |
| 6,811,291 B1 * | 11/2004 | Short, III ................. | 324/76.19 |

* cited by examiner

Primary Examiner—Diane Lee
Assistant Examiner—Timothy J. Dole
(74) Attorney, Agent, or Firm—Arent Fox, PLLC.

(57) ABSTRACT

An object of this invention is to provide a band distribution inspecting device and band distribution inspecting method capable of carrying out inspection on whether or not a scattered oscillation signal oscillated containing a frequency variation from the fundamental frequency with the fundamental frequency as a reference point has a band distribution rapidly, with a simple way and at a cheap price. A scattered oscillation signal SSS inputted to a band distribution detecting section 22 is outputted as a predetermined band pass signal SBP through a band pass filter 17 having a predetermined pass band of a predetermined narrow-band width $\Delta f$ within a band distribution. This signal is converted to a root-mean-square value by a smoother 19, smoothed by a capacitor C1 and transferred to a general purpose inspecting device 21 as a DC signal SAV. The DC signal SAV is compared with a predetermined voltage value VX by a comparator 25 and its comparison result is judged by a judging section 25 and then, an inspection result is outputted as a judging signal J. As a result, an edge frequency in the band distribution of the scattered oscillation signal SSS and disturbance of frequency variation within/out of the band and dullness in waveform and the like can be inspected for.

20 Claims, 8 Drawing Sheets

CIRCUIT BLOCK DIAGRAM DIRECTED FIRST EMBODIMENT

FIG.1 CIRCUIT BLOCK DIAGRAM DIRECTED FIRST EMBODIMENT

VIEW SHOWING FRAME FORMAT OF DEVICE STRUCTURE
FOR SPECTRUM SCATTERING

SSCG IS SEPARATE BODY

SSCG IS BUILT IN

CIRCUIT BLOCK DIAGRAM DIRECTED TO SECOND EMBODIMENT

INSPECTING METHOD DIRECTED TO SECOND EMBODIMENT

FIG.6 CIRCUIT BLOCK DIAGRAM OF VARIANT DIRECTED TO SECOND EMBODIMENT

CIRCUIT BLOCK OF MAIN PORTION DIRECTED
TO THIRD EMBODIMENT

IN CASE CYCLE OF RSM OUTPUT IS DETECTED

IN CASE DUTY OF RSM OUTPUT IS DETECTED

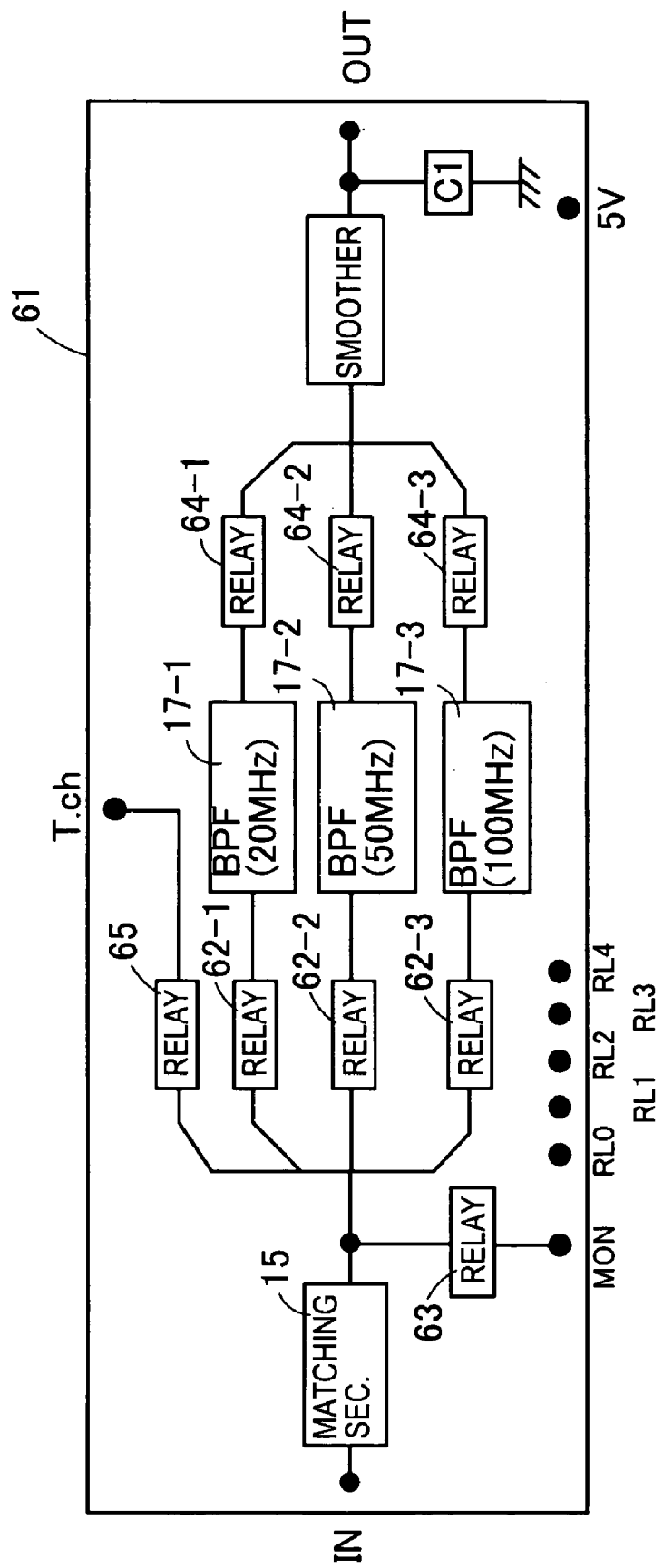

BAND DISTRIBUTION INSPECTING DEVICE AND BAND DISTRIBUTION INSPECTING METHOD

CROSS-REFERENCE TO RELATED APPLICATIONS

This application is based upon and claims the benefit of priority from each of the prior Japanese Patent Application No. 2003-319243 filed on Sep. 11, 2003, the entire contents of which are incorporated herein by reference.

BACKGROUND OF THE INVENTION

1. Field of the Invention

The present invention relates to a band distribution inspecting device and band distribution inspecting method for measuring a frequency distribution in a scattered oscillation signal oscillated containing a frequency variation from the fundamental frequency and particularly, to a band distribution inspecting device and band distribution inspecting method for determining a band distribution in the frequency variation in a short time.

2. Description of Related Art

In recent years, electronic apparatuses such as personals computer and printers have become highly functional so that high-speed operation and high-density integration have been progressed. Thus, in addition to employing higher frequency as the oscillation frequency of a clock signal supplied to electronic apparatuses and increased emission of electromagnetic interference (hereinafter referred to as EMI) in oscillation frequency and harmonics, influences upon adjoining components and devices of the EMI cannot be neglected.

As a countermeasure for reducing the EMI intensity, recently, spectrum scattering technology has attracted public attention. If the spectrum scattering technology is applied to the oscillation frequency of the clock signal, the oscillation frequency of the clock signal can be changed cyclically from the fundamental frequency. As a result, the EMIs emitted from the spectrum-scattered clock signal or/and an electronic apparatus driven by the scattered clock signal are scattered for each frequency. The EMI intensity is never increased by a specific frequency and the EMI intensity of harmonic component can be reduced.

Here, the EMI intensity peak decreases depending on the frequency band scattered by the frequency variation from the fundamental frequency. As the scattering rate increases, the EMI intensity peak decreases. The reason is that if a wider frequency scattering occurs, the EMI intensity emitted at each frequency decreases. If the band distribution by the spectrum scattering is adjusted depending on usage environment of an electronic apparatus or permissible EMI intensity, the EMI intensity can be reduced within an oscillation frequency permitted to the clock signal from the viewpoint of the operation specification of electronic apparatus.

For a device and apparatus on which the spectrum scattering technology is applied, it is necessary to inspect that the band distribution can be adjusted depending on the setting. This is outgoing inspection for a device or apparatus. Band distribution of the oscillation frequency upon the scattered clock signal is carried out according to measurement by a spectrum analyzer or analysis or the like on data acquired by a digitizer.

Measurement by the spectrum analyzer or digitizer can acquire the occupation rate of each frequency component accurately which the spectrum-scattered clock signals occupy in an entire range of the measurement frequency.

SUMMARY OF THE INVENTION

However, although the conventional measuring method is an effective method if detailed data analysis is necessary on development stage or fault analysis stage or the like, it comes that data unnecessary for determination on whether or not the outgoing inspection on a device is acceptable is also acquired. Thus, it takes long hours to acquire such unnecessary data and process the acquired data, so that it takes a long inspection time for the outgoing inspection, which is a problem to be solved.

To cope with the high speed clock signal, the spectrum analyzer and digitizer need to have a high speed and high accuracy. The inspection apparatus having such a function are expensive and if these functions are provided separately from the general purpose inspecting device, the inspecting apparatus may be complicated. Consequently, an increase in inspection cost on the outgoing inspection is induced.

If a spectrum analyzer is used, it can be considered to provide with the spectrum analyzer separately from the general purpose inspecting device to cope with the high speed clock signal. In this case, the analyzer and inspection device are connected to each other through an interface such as GPIB. It may take long hours to exchange command and data through the interface even if the measurement by the analyzer is completed, so that the inspection time may be increased.

If the clock signal is sampled by the digitizer at a predetermined time interval, the clock signal is subjected to spectrum scattering so that the oscillation frequency swings cyclically. Thus, continuous sampling for every predetermined time interval is necessary. This is a so-called time interval analyze (TIA) method. The reason why this method is adopted is that a method for compensating for data by sampling every cycle and deviating the sampling timing gradually is incapable of catching up the frequency variation.

Because continuous sampling at every minute time interval is demanded for high-speed clock signal, a high-speed and high-accuracy digitizer is needed. Thus, an inspection device having high-speed and high accuracy digitizing function is required, so that there is a fear that such a required apparatus may become expensive.

To acquire smooth data without any sampling error between the frequencies, the sampling needs to be repeated several cycles of the fundamental frequency so as to average the acquired data. In case of a frequency variation of 12 kHz, for example, 60,000 point sampling may be sometimes required although it depends upon a resolution to be acquired. Total time necessary for the sampling operation extends up to several seconds. Long hours may be needed for data sampling by the digitizer.

It may take long processing time for the FFT processing of converting data acquired by AD conversion to digital value on time axis to its appearance frequency on the frequency axis.

The present invention has been achieved to solve at least any one of the above-described problems of the conventional technology and provides a band distribution inspecting device and band distribution inspecting method capable of inspecting whether or not the scattered oscillation signal oscillated containing a frequency variation from the fundamental frequency as a reference point contains a predetermined band distribution rapidly, simply and at cheap price.

According to a first aspect of the present invention, there is provided a band distribution inspecting device for inspecting the band distribution of a scattered oscillation signal oscillated containing a frequency variation from the fundamental frequency with the fundamental frequency of the fundamental oscillation signal as a reference point, comprising: a band pass filter which the scattered oscillation signal is inputted to and has a predetermined pass band of a predetermined narrow-band width with respect to the band distribution; and a signal strength detector which receives a predetermined band pass signal outputted from the band pass filter and outputs a band strength signal corresponding to a signal amplitude, wherein the band distribution is inspected according to a change in the position of band distribution shifted corresponding to the fundamental oscillation signal in which the fundamental frequency changes, with respect to the predetermined band pass signal.

In the band distribution inspecting device of the first aspect, by changing the fundamental frequency of the fundamental oscillation signal, the fundamental frequency of the scattered oscillation signal outputted based on the fundamental oscillation signal is also changed. The band pass filter which the scattered oscillation signal is to be inputted to has a predetermined pass band of a predetermined narrow-band width with respect to the band distribution and outputs a predetermined band pass signal fixed to the predetermined pass band. The predetermined band pass signal is inputted to a signal strength detector and a band strength signal corresponding to the signal amplitude is outputted. When the fundamental frequency of the scattered oscillation signal is changed, the relative position of the predetermined pass band in the band distribution of the scattered oscillation signal is shifted because the predetermined pass band of the band pass filter is fixed.

Further, according to the first aspect of the present invention, there is also provided a band distribution inspecting method for inspecting the band distribution of a scattered oscillation signal oscillated containing a frequency variation from the fundamental frequency with the fundamental frequency of the fundamental oscillation signal as a reference point, comprising: a frequency setting step of changing the fundamental frequency of the fundamental oscillation signal successively; a predetermined band selecting step of selecting a predetermined band signal of a predetermined narrow-band width with respect to a band distribution at a predetermined band position in the scattered oscillation signal; and a signal strength detecting step of outputting a band strength signal corresponding to a signal amplitude of a selected predetermined band signal, so as to inspect a band distribution.

According to the band distribution inspecting method of the first aspect, the fundamental frequency of the fundamental oscillation signal is changed successively so as to change the fundamental frequency of the scattered oscillation signal successively in the frequency setting step. In the predetermined band selecting step, a predetermined band signal of a predetermined narrow-band width with respect to the band distribution at a fixed predetermined band position is selected for each of set fundamental frequencies. In the signal strength detecting step, a band strength signal corresponding to the signal amplitude of a selected predetermined band signal is outputted.

Consequently, the relative position of the band distribution of the scattered oscillation signal with respect to a fixed predetermined pass band or a fixed predetermined band position is changed because the fundamental frequency is changed in the scattered oscillation signal with the expansion characteristic of the band distribution from the fundamental frequency maintained. The signal strength is detected corresponding to the predetermined band pass signal of the predetermined pass band or the signal amplitude of the predetermined band signal at the predetermined band position and as a result, the signal strength of a predetermined pass band or predetermined band position in the band distribution of the scattered oscillation signal can be detected. A signal distribution of each frequency step can be detected in the band distribution by adjusting the frequency step for changing the fundamental frequency.

The scattered oscillation signal mentioned here refers to a clock signal which changes the oscillation frequency periodically using a spectrum scattering technology effective for EMI countermeasure and a clock signal or other oscillation signal containing a frequency variation such as jitters or an oscillation signal in which the oscillation frequency is scattered in a predetermined band thereof.

When the band distribution of the scattered oscillation signal is inspected, detailed data collection or data analysis necessary when the spectrum analyzer or digitizer is used is not necessary and only the band strength needs to be detected corresponding to the signal amplitude of a predetermined band pass signal or predetermined band signal for each frequency step, thereby the inspection time being reduced.

A high-speed, high-precision spectrum analyzer or digitizer, which is necessary when the fundamental frequency of a scattered oscillation signal is of a high frequency, is not necessary and no other high-speed, high-precision function circuit is needed if the fundamental oscillation signal is oscillated at the fundamental frequency of a high frequency. Consequently, a general purpose inspecting device can be used and no additional device or additional step is needed except that an additional function for achieving the fundamental frequency of a high frequency is provided. No exchange of complicated signals with the inspecting device is needed. Consequently, the inspecting device can be simplified and the inspection cost can be suppressed.

According to a second aspect of the present invention, there is provided a band distribution inspecting device for inspecting the band distribution of a scattered oscillation signal oscillated containing a frequency variation from the fundamental frequency as a reference point, comprising: plural band pass filters which include pass band of a predetermined narrow-band width for each band position in the band distribution and which the scattered oscillation signal is to be inputted; and a signal strength detector which receives a band pass signal outputted from each of the band pass filters and outputs a band strength signal corresponding to the signal amplitude, wherein the band distribution is inspected corresponding to a band pass signal from each of the band pass filters.

The band distribution inspecting device of the second aspect includes plural band pass filters having a pass band of a predetermined narrow-band width for each band position in the band distribution and a scattered oscillation signal is inputted to each band pass filter. A band pass signal for each band position is outputted from each band pass filter. Each band pass signal is inputted to the signal strength detector and a band strength signal corresponding to the signal amplitude is outputted.

According to a second aspect of the present invention, there is provided a band distribution inspecting method for inspecting the band distribution of a scattered oscillation signal oscillated containing a frequency variation from the fundamental frequency as a reference point, comprising: a band selecting step of selecting a band signal of a predetermined narrow-band width for each band position with respect to a band distribution of the scattered oscillation signal; and a signal strength detecting step of outputting a band strength signal corresponding to the signal amplitude of a band signal for each selected band signal, so as to inspect the band distribution.

According to the band distribution inspecting method of the second aspect, the band signal of a predetermined narrow-band width relative to the band distribution is selected for each band position in band selecting step and a band strength signal corresponding to the signal amplitude of each selected band signal is outputted.

The signal strength is detected corresponding to the signal amplitude of the band pass signal or band signal for each band position in the band distribution from the fundamental frequency in the scattered oscillation signal, so that the signal strength in the band distribution of the scattered oscillation signal can be detected. The signal distribution between the frequency steps in the band distribution can be detected by adjusting the frequency step which is an interval of pass band between the band pass filters or an interval of band position in the band selecting step.

When the band distribution of the scattered oscillation signal is inspected, detailed data collection or data analysis necessary when the spectrum analyzer or digitizer is used is not necessary and only the band strength needs to be detected corresponding to the signal amplitude of a band pass signal or band signal for each frequency step, thereby the inspection time being reduced.

A high-speed, high-precision spectrum analyzer or digitizer, which is necessary when the fundamental frequency of a scattered oscillation signal is of a high frequency, is not necessary and no other high-speed, high-precision function circuit is needed if there is an oscillator section or frequency setting step of oscillating the fundamental oscillation signal with the fundamental frequency of a high frequency. Consequently, a general purpose inspecting device can be used and no additional device or additional step is needed except that the oscillator section or frequency setting step for achieving the fundamental frequency of a high frequency is provided. Thus, the inspecting device can be simplified and the inspection cost can be suppressed.

The above and further novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 2A is a view showing frame format of device structure for spectrum scattering in which SSCG is a separate body;

FIG. 2B is a view showing frame format of device structure for spectrum scattering in which SSCG is built in;

FIG. 8 shows a packaging example of module substrate that realizes first embodiment.

DETAILED DESCRIPTION OF THE PREFERRED EMBODIMENTS

Hereinafter, the preferred embodiments of the band distribution inspecting device and band distribution inspecting method of the present invention will be described in detail with reference to FIGS. 1–8.

Figure 1:
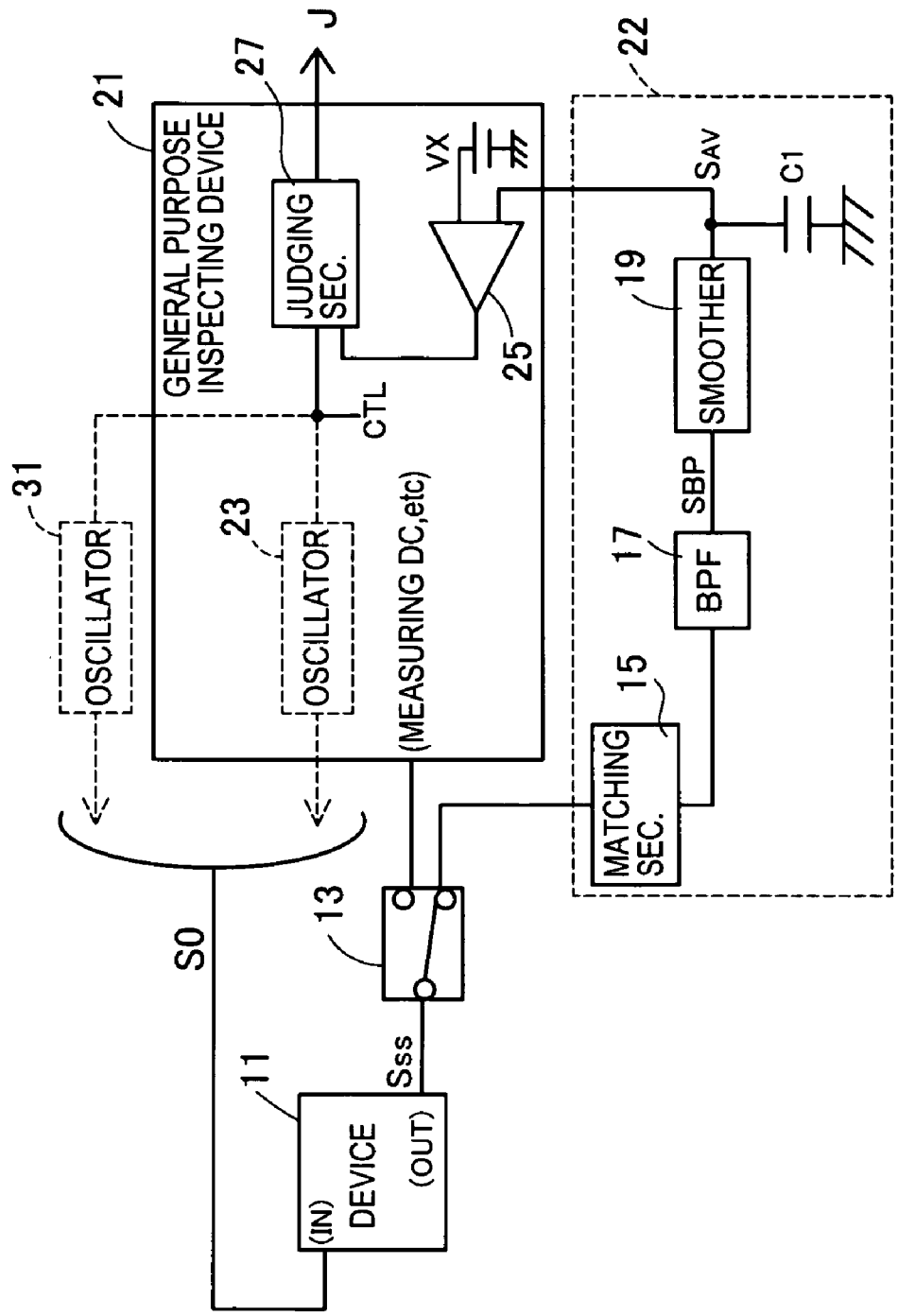
FIG. 1 is a circuit block diagram directed to a first embodiment.
Figure 2:
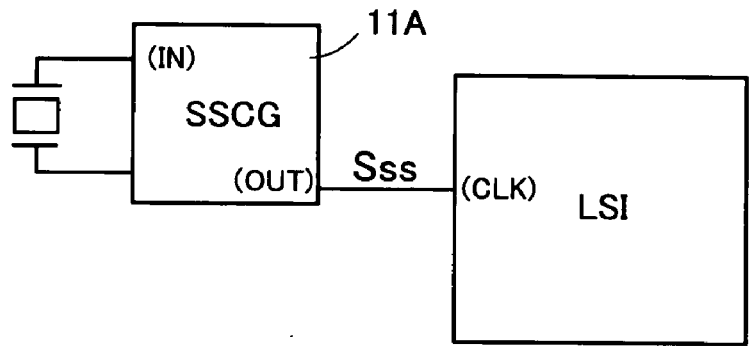
Figure 2:
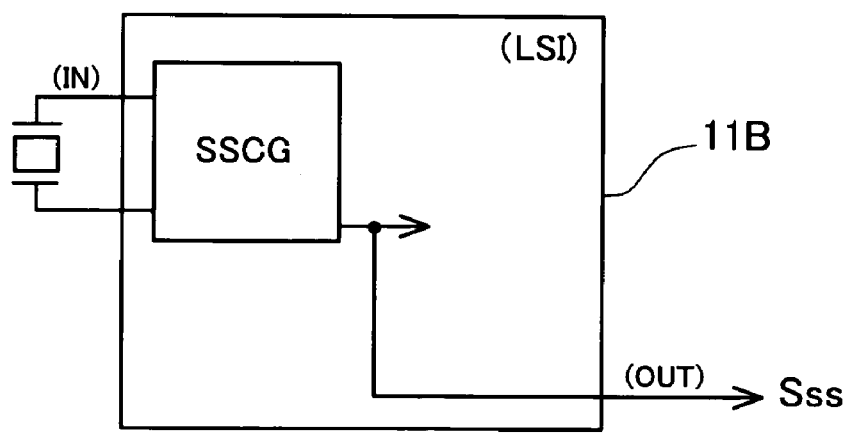

FIG. 1 is a circuit block diagram of a band distribution inspecting device of the first embodiment. This figure shows a spectrum scattering clock generator (hereinafter referred to as SSCG) device 11 in which the scattered oscillation signal SSS in which the oscillation frequency is scattered is outputted from an OUT terminal to the fundamental oscillation signal S0 of a fundamental frequency f0 inputted to an IN terminal.

The OUT terminal of a device 11 is connected to a general purpose inspecting device 21 or a band distribution detecting section 22 through a relay 13. The connection to the general purpose inspecting device 21 is for DC measurement about input/output voltage, current and the like on the OUT terminal. The connection to the band distribution detecting section 22 is for inspecting the band distribution on the oscillation frequency in the scattered oscillation signal SSS outputted from the OUT terminal. The band distribution detecting section 22 is a section for detecting the signal strength of a predetermined pass band in the scattered oscillation signal SSS in the band distribution inspecting device.

The band distribution detecting section 22 comprises a matching section 15 provided if impedance matching on a signal path is necessary, a band pass filter 17 having a predetermined pass band of a predetermined narrow-band width in the band distribution of the scattered oscillation signal SSS, a smoother 19 for smoothing the predetermined band pass signal SBP from the band pass filter 17 on the oscillation frequency band of the scattered oscillation signal SSS and a capacitor C1 for smoothing an output signal form the smoother 19 at the frequency variation cycle of the scattered oscillation signal SSS, these components being provided on a signal route of the scattered oscillation signal SSS to be inputted from the relay 13.

The predetermined band pass signal SBP from the band pass filter 17 is smoothed by the smoother 19 and converted to a voltage value by averaging corresponding to the signal amplitude of the predetermined band pass signal which is an oscillation signal. Here, as a specific example of the smoother 19, an RMS-DC circuit for obtaining the root-mean-square value (RMS) of the oscillation signal or the like can be considered. Preferably, the signal amplitude of the predetermined band pass signal SBP is amplified as required at this time. If the range of an acquired RMS is wide, it is converted to logarithm by the logarithmic amplifier. As a specific example of the RMS-DC circuit, IC products such as AD536, AD637 and the like made by Analog Devices, LTC-1966 made by Linear Technology and the like can be applied. As a logarithmic amplifier, for example, IC products such as AD8306, AD8307 made by Analog Devices can be applied.

Because the scattered oscillation signal SSS outputted from the device 11 is an oscillation signal whose frequency is deflected cyclically due to spectrum scattering, generally, the signal amplitude has a frequency distribution in which the amplitudes of frequencies on both sides decrease around the oscillation frequency having the largest amplitude. Because the oscillation frequency of the scattered oscillation signal SSS changes across the predetermined pass band fixed in the band pass filter 17, the signal amplitude of the predetermined band pass signal SBP changes at the oscillation cycle of the oscillation frequency, so that a swell in RMS coinciding with the oscillation cycle of the oscillation frequency is generated in a signal smoothed by the smoother 19 as the RMS.

If the frequency variation is disturbed in the scattered oscillation signal SSS so that the variation velocity is not constant or if there is a dullness or distortion in the scattered oscillation signal SSS, the amplitude distribution of the scattered oscillation signal SSS sometimes turns into a distribution in which the amplitudes of the frequencies on both the sides of the oscillation frequency having the largest amplitude decreases gradually so that it deflects from the predetermined frequency distribution. In this case, it is considered that the symmetry or periodicity of a cyclic voltage change is destroyed due to the swell in the RMS so that a time rate that the voltage value is higher than the central voltage of the swell (hereinafter referred to as duty of swell) is deflected from 50% or the cycle of the swell is deflected from the predetermined period. Further, because the time rate that oscillation at a specific frequency occurs due to waveform dullness or waveform distortion increases or decreases, it can be considered that a specific point of the frequency that the signal strength is intensified or weakened occurs.

The capacitor C1 averages the swell of the RMS described above, the symmetry and periodicity of the swell, the specific point in the swell and the like.

Consequently, the swell of the RMS is averaged so as to obtain DC signal SAV. The relative position of the frequency variation of the scattered oscillation signal SSS with respect to the predetermined pass band in the band pass filter 17 is acquired as a DC value. That is, if the oscillation frequency of the scattered oscillation signal SSS traverses the predetermined pass band because of the frequency variation, the smoother 19 detects an oscillation signal having the largest amplitude so as to acquire a high DC signal SAV. If the oscillation frequency of the scattered oscillation signal SSS does not traverse the predetermined pass band, the smoother 19 detects only an oscillation signal having a small amplitude so as to obtain a small DC signal SAV.

The DC signal SAV is sent to the comparator 25 in the general purpose inspecting device 21 and compared with the predetermined voltage value VX by the comparator 25. The comparison result is judged by the judging section 27 about whether or not it is acceptable and the inspection result is outputted as a judging signal J. The predetermined voltage value VX refers to a threshold voltage which defines the scattering rate of the spectrum scattering in the frequency variation of the scattered oscillation signal SSS. The voltage level of the DC signal SAV provides a scale for indicating the position of the frequency variation of the scattered oscillation signal SSS with respect to the predetermined pass band in the band pass filter 17 and a scale for indicating the time rate that the scattered oscillation signal SSS oscillates in the predetermined pass band. Consequently, by adjusting the predetermined voltage value VX, an end frequency in the band distribution of the scattered oscillation signal SSS can be inspected and further, a disturbance in the frequency variation and dullness and distortion in the waveform inside or/and outside the band can be inspected.

By adopting a structure for controlling the predetermined voltage value VX corresponding to the content of judgment in the judging section 27, multi-stage inspection on a detection result obtained as the DC signal SAV can be carried out. For example, as a first inspection, the DC signal SAV is compared with the predetermined voltage value VX indicating the border of band and it is determined which the scattered oscillation signal SSS at that time is a signal within the band or a signal out of the band. If that signal is within the band, as a second inspection, the DC signal SAV is compared with the predetermined voltage value VX indicating the specific point and the degree in each of the symmetry, periodicity, dullness and distortion of the frequency variation in the scattered oscillation signal SSS is determined.

The fundamental oscillation signal SO is outputted from the oscillator section 23 provided on the general purpose inspecting device 21 or the oscillator 31 provided separately. A control signal CTL from the general purpose inspecting device 21 is inputted to the oscillator section 23 or the oscillator 31.

As described above, the band distribution inspecting device of the first embodiment includes the band pass filter 17 having a fixed predetermined pass band. When the band distribution of the scattered oscillation signal SSS outputted from the device 11 is inspected, the fundamental frequency of the fundamental oscillation signal s0 inputted to the device 11 is changed gradually from f0 and the band distribution of the scattered oscillation signal SSS is shifted to change the relative position of the predetermined pass band. Changes in the fundamental frequency are controlled by the control signal CTL. Because the control signal CTL is outputted corresponding to a completion of judgment by the judging section 27, the inspection can be carried out by changing the fundamental frequency of the fundamental oscillation signal S0 successively.

The operation performance demanded for the general purpose inspecting device 21 does not always need to have as high a speed as the operation speed of the fundamental frequency which the device 11 can handle. The reason is that the general purpose inspecting device 21 only can determine a DC signal SAV averaged by the smoother 19 and capacitor Cl and does not have to detect the oscillation frequency of the scattered oscillation signal SSS directly. The fundamental oscillation signal SO can be supplied from the oscillator section 23 of the general purpose inspecting device 21. If the fundamental frequency exceeds the operation performance of the oscillator section 23, it can be supplied from the oscillator 31 provided separately. A signal to be detected when the oscillator 31 is used is also the DC signal SAV. By providing with the oscillator 31 based on high-speed operation specification corresponding to the operation performance of the device 11, even the general purpose inspecting device 21 having no high-speed performance can inspect.

FIG. 2A and FIG. 2B show a specific example of the SSCG device 11. To convert the operation clock signal of an integrated circuit (LSI) to a spectrum scattered oscillation signal as a countermeasure against EMI, the scattered oscillation signal SSS is supplied from outside of the integrated circuit (LSI) using a dedicated SSCG device 11A for spectrum-scattering the fundamental clock signal from a crystal oscillator (case of FIG. 2A) or a SSCG section for spectrum-scattering the fundamental clock signal is provided on the integrated circuit (LSI) 11B (case of FIG. 2B). Here, assume that the integrated circuit (LSI) 11B is provided with an OUT terminal for outputting the scattered oscillation signal SSS. According to the first embodiment (FIG. 1), by providing with the SSCG device 11A or the integrated circuit (LSI) 11B instead of the SSCG device 11, the band distribution of the scattered oscillation signal SSS can be inspected.

Figure 3:
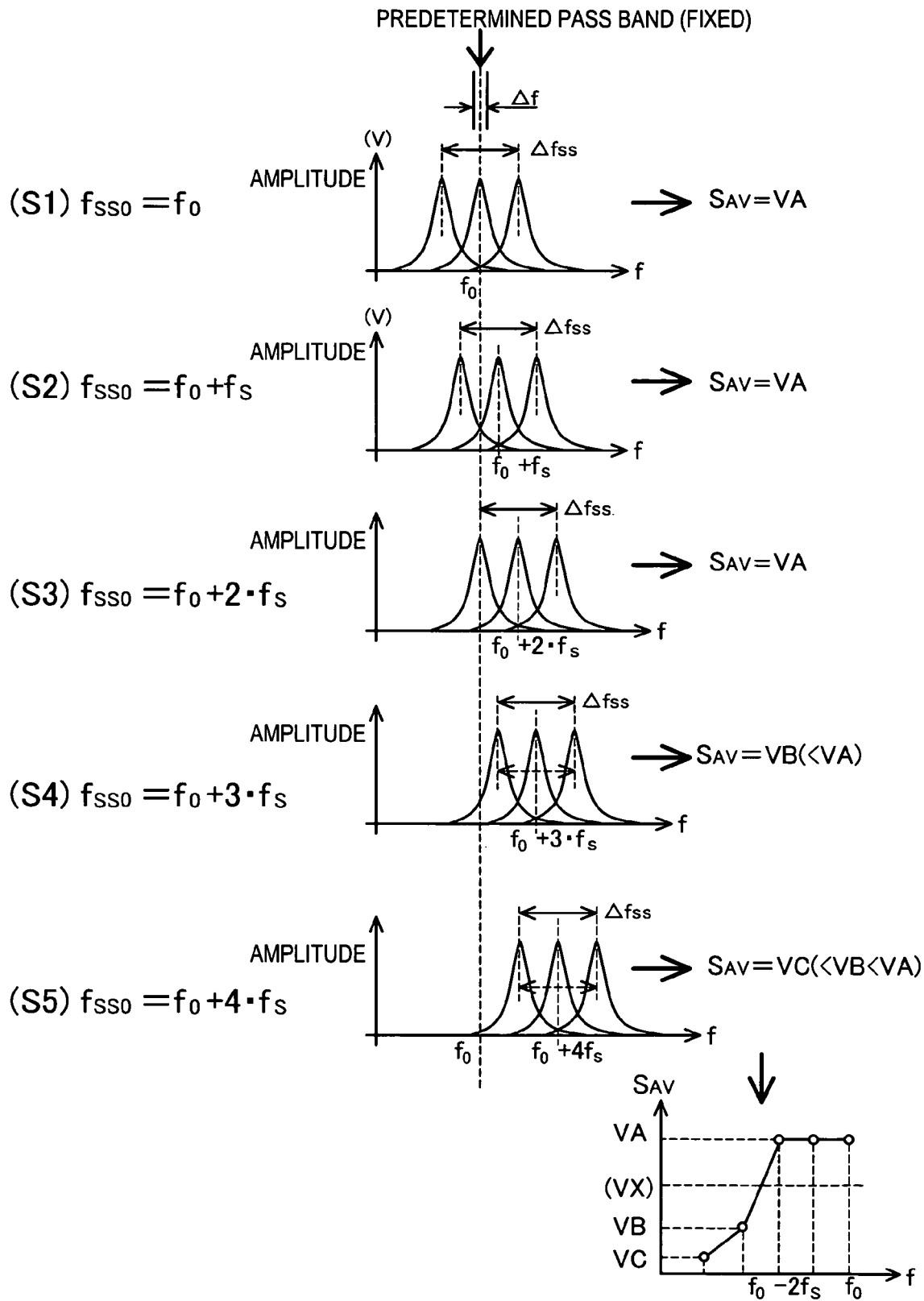
FIG. 3 is a diagram illustrating inspection method directed to the first embodiment.

FIG. 3 shows an example of the inspection method for inspecting the band distribution of the scattered oscillation signal SSS in the band distribution inspecting device (FIG. 1) of the first embodiment. A following description is carried out with the band distribution inspecting device shown in FIG. 1.

The predetermined pass band of the band pass filter 17 is uniquely set up around a fundamental frequency f0 having a predetermined narrow-band width Δf. A fundamental oscillator signal S0 is supplied from the oscillation section 23 or oscillator 31 corresponding to the control signal CTL and according to the inspection method of FIG. 3, the fundamental frequency increases at a frequency step fS each time of determination on the DC signal SAV. The fundamental oscillation signal s0 is spectrum-scattered when it is inputted into the device 11, so that the scattered oscillation signal SSS whose frequency varies with a deflection width ΔfSS around the fundamental frequency is outputted. Here, assume that there is a relation of fS=(¼) ΔfSS. In a graph of FIG. 3, its abscissa axis indicates oscillation frequency while the ordinate axis indicates signal amplitude. It is assumed that there is no disturbance in the frequency variation for simplification to describe FIG. 3.

Here, the predetermined narrow-band width Δf, which is a predetermined pass band of the band pass filter 17, is adjusted corresponding to a necessary inspection resolution. If the band width is set narrower, inspection at a narrower frequency step fS is possible. As the band pass filter, for example, use of a crystal filter can be considered. If the crystal filter is used, ten and several kHz can be realized as the predetermined narrow-band width Δf, thereby enabling inspection with a sufficiently narrow band width.

In step 1 (S1), the fundamental frequency of the fundamental oscillation signal S0 is f0. The center frequency fSS0 of the frequency variation of the scattered oscillation signal SSS is fundamental frequency f0 (fSS0=f0) and its frequency varies with a deflection width ΔfSS. The predetermined pass band of the band pass filter 17 is fundamental frequency f0 and exists within a band in which the scattered oscillation signal SSS varies in frequency. Thus, the oscillation frequency and predetermined pass band of the scattered oscillation signal SSS meet each other at each period of the frequency variation so that its maximum amplitude can be detected. The DC signal SAV turns to maximum voltage value VA.

In steps 2, 3 (S2, S3), the fundamental frequency of the fundamental oscillation signal is f0+fS, F0+2fS. The center frequency fSS0 of the frequency variation in the scattered oscillation signal SSS is fundamental frequency f0+fS, f0+2fS (fSS0=f0+fS, fSS0=f0+2fS). In these cases, the predetermined pass band (fundamental frequency f0) is within a band in which the scattered oscillation signal SSS varies in frequency. Thus, the oscillation frequency of the scattered oscillation signal SSS and the predetermined pass band meet each other each period of the frequency variation so as to detect a maximum amplitude. The DC signal SAV is a maximum voltage value VA. If fSS0=f0+2fS, the predetermined pass band (fundamental frequency f0) turns to a frequency located at the bottom end of the scattered oscillation signal SSS.

In step 4 (S4), the fundamental frequency of the fundamental oscillation signal S0 is f0+3fS. The center frequency fSS0 of the frequency variation in the scattered oscillation signal SSS is fundamental frequency f0+3fS (fSS0=f0+3fS). In this case, the predetermined pass band (fundamental frequency f0) is out of a band below the lower limit position of the scattered oscillation signal SSS. Thus, the oscillation frequency of the scattered oscillation signal SSS in the frequency variation is always located on the side of higher frequency than the predetermined pass band, so that no maximum amplitude can be detected. The DC signal SAV is a voltage value VB (<VA).

In step 5 (S5), the fundamental frequency of the fundamental oscillation signal S0 is f0+4fS. The high frequency fSS0 of the frequency variation in the scattered oscillation signal SSS is fundamental frequency f0+4fS (fSS0=f0+4fS). In this case, the predetermined pass band (fundamental frequency f0) is located out of a band below the lower limit position of the scattered oscillation signal SSS. Thus, the DC signal SAV is a voltage value VC (<VB<VA).

If DC signals SAV detected in steps 1 (S1)–5(S5) are plotted to the oscillation frequency of the scattered oscillation signal SSS, a band distribution can be obtained. In this case, note that the frequency value on the abscissa axis is a frequency located opposite to the fundamental frequency shifted at the fundamental oscillation signal S0 across a frequency f0 due to the relative positional relation between the band distribution of the fundamental oscillation signal S0 and the predetermined pass band. By adjusting the predetermined voltage value VX on the comparator 25, an edge frequency in the band distribution can be detected. According to FIG. 3, a frequency f0–2fS can be obtained as the lower limit frequency.

Although it is not shown, if the predetermined voltage value VX is adjusted into a range of a predetermined voltage width from the maximum voltage value VA, the evenness of the DC signal SAV in the band can be recognized. Whether or not there is a disturbance in the waveform in the frequency variation of the scattered oscillation signal SSS can be inspected.

Although FIG. 3 indicates only the low frequency side with respect to the fundamental frequency f0, needless to say, the high frequency side can be obtained if the oscillation frequency at the fundamental oscillation signal S0 is decreased successively.

Figure 4:
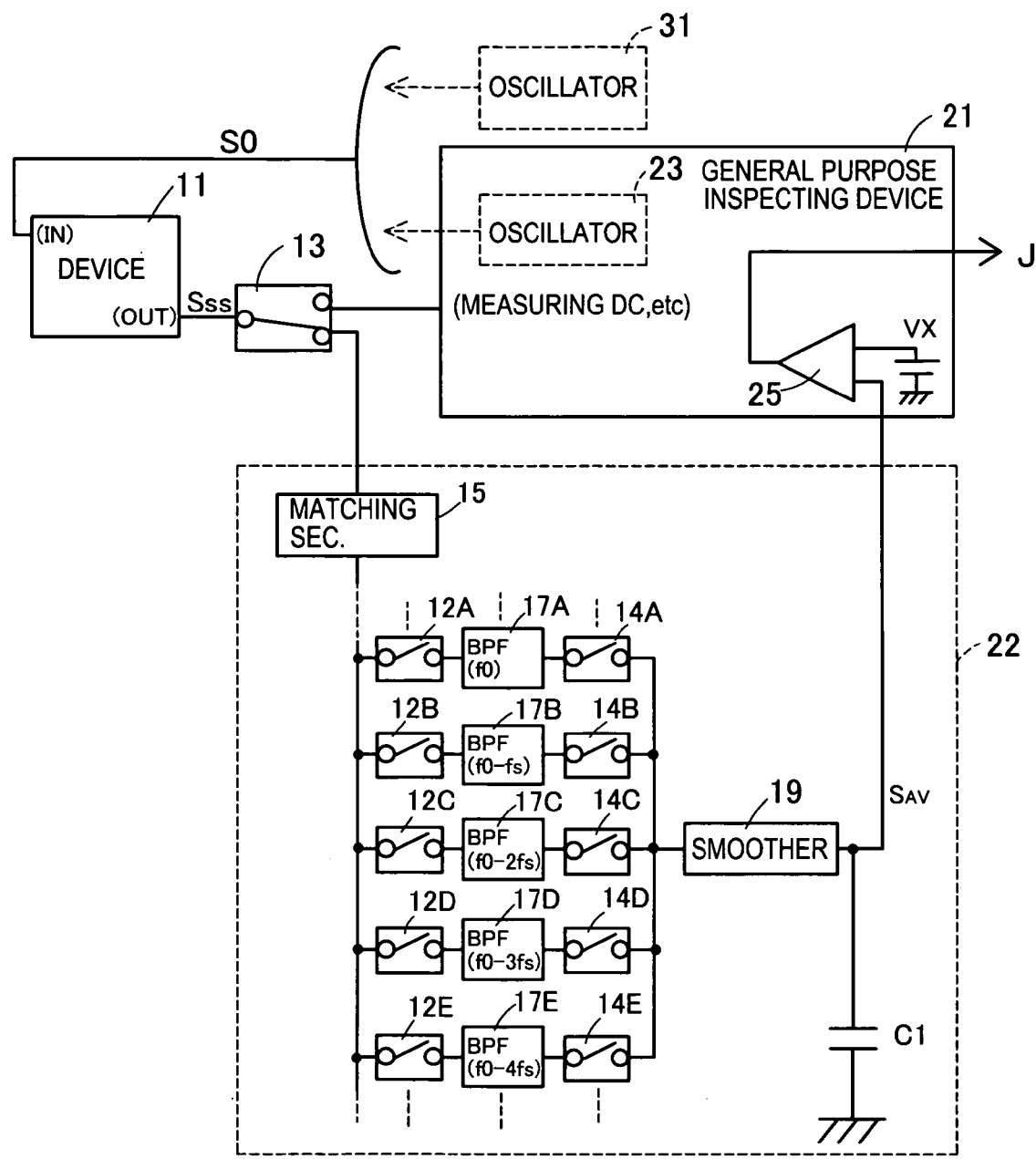
FIG. 4 is a circuit block diagram directed to a second embodiment.

According to a-circuit block diagram of the band distribution inspecting device of the second embodiment shown in FIG. 4, instead of the band pass filter 17 of the first embodiment (FIG. 1), plural band pass filters ( . . . 17A–17E, . . . ) whose pass band differs by each frequency step fS are provided. Switches ( . . . 12A–12E, . . . ) ( . . . 14A–14E . . . ) controlled by the control signal CTL are provided on both ends of each band pass filter. Unlike the first embodiment (FIG. 1), the oscillator section 23 or oscillator 31 is not controlled by the control signal CTL and the fundamental frequency f0 of the fundamental oscillation signal S0 to be outputted is fixed.

Figure 5:
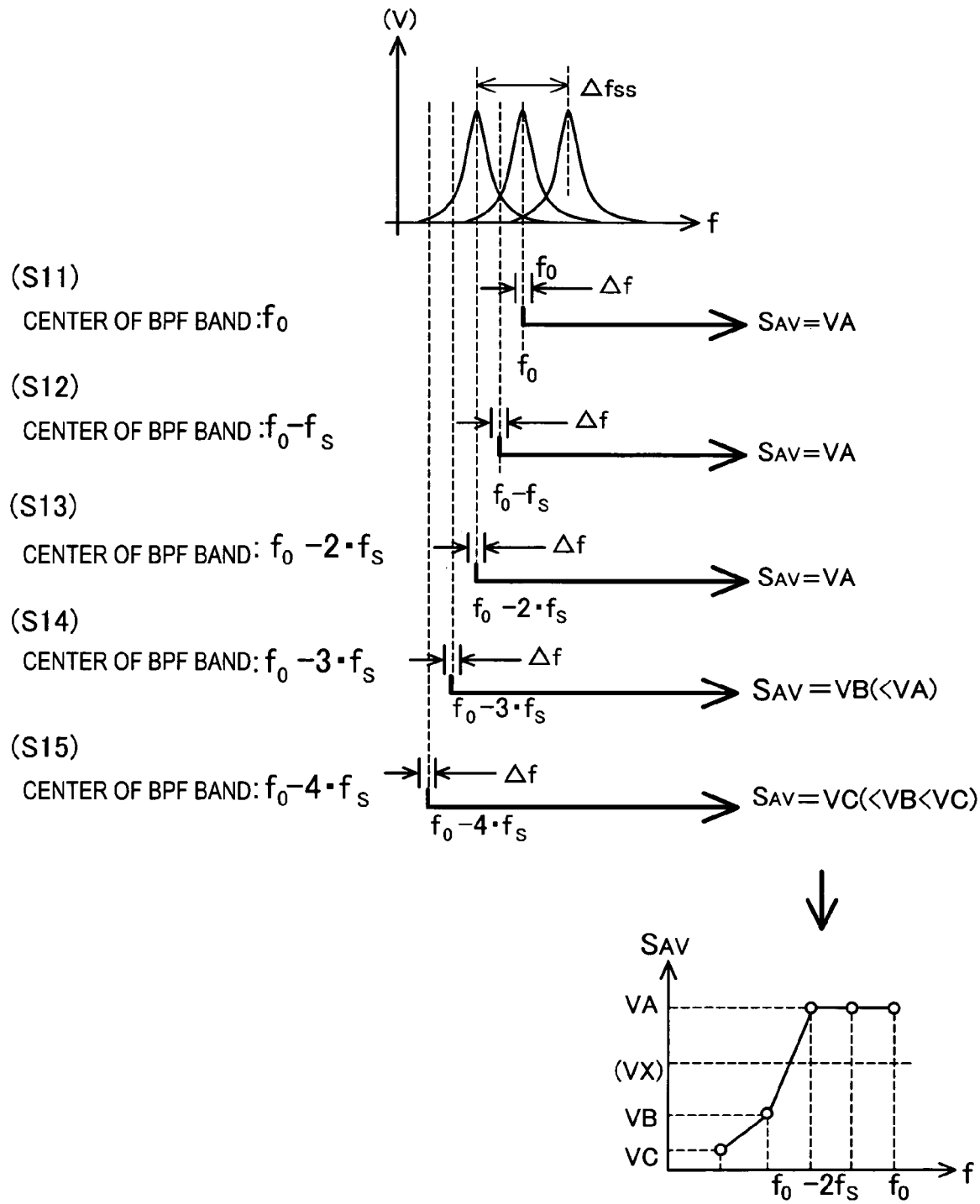
FIG. 5 is a diagram illustrating inspection method directed to the second embodiment.

FIG. 5 shows an example of an inspection method for inspecting the band distribution of the scattered oscillation signal SSS in the band distribution inspecting device (FIG. 4) of the second embodiment. A following description will be carried out with reference to the band distribution inspecting device shown in FIG. 4.

Because according to the second embodiment, the fundamental frequency of the fundamental oscillation signal S0 is fixed to f0, the scattered oscillation signal SSS varies in frequency with a deflection width ΔfSS with respect to the fundamental frequency f0. Therefore, only a pair of switches of plural switches ( . . . 12A–12E, . . . ), ( . . . 14A– 14E . . .) are turned ON. and the switches are changed over successively. Consequently, only a filter of plural band pass filters ( . . . 17A–17E, . . . ) is selected successively and the inspection is carried out by shifting the pass band successively within the band of the scattered oscillation signal SSS.

In step 11 (S11), the switches 12A and 14A are turned ON. The band pass filter 17A is selected and signal detection is carried out in a pass band around the fundamental frequency f0. This pass band exists within the band in which the scattered oscillation signal SSS varies in frequency and the oscillation frequency of the scattered oscillation signal SSS and the pass band meet each other each period of the frequency variation so as to detect a maximum amplitude. The DC signal SAV is a maximum voltage value VA.

In steps 12, 13 (S12, S13), the switches 12B, 14B, 12C and 14C are turned ON successively. The band pass filters 17B, 17C are selected successively and signal detection is carried out successively with a pass band around the fundamental frequencies f0–fS, f0–2fS. This pass band is located within a band in which the scattered oscillation signal SSS varies in frequency and the oscillation frequency of the scattered oscillation signal SSS and the pass band meet each other each period of the frequency variation so as to detect a maximum amplitude. The DC signal SAV is a maximum voltage VA. In the meantime, the fundamental frequency f0–2fS is a frequency located at the lower limit of the band of the scattered oscillation signal SSS.

In step 14 (S14), the switches 12D and 14D are turned ON. A band pass filter 17D is selected, so that signal detection is carried out in a pass band around the fundamental frequency f0–3f0. This pass band is located out of a band below the lower limit of the band of the scattered oscillation signal SSS. Thus, the oscillation frequency of the scattered oscillation signal SSS is always located on the side of a higher frequency than the pass band in the frequency variation, so that no maximum amplitude can be detected. The DC signal SAV is a voltage value VB (<VA).

Further, in step 15 (S15), the switches 12E and 14E are turned ON. The band pass filter 17E is selected so that signal inspection is carried out in a pass band around the fundamental frequency f0–4f0. This pass band is located out of a band below the lower limit of the band of the scattered oscillation signal SSS. Thus, the DC signal SAV is a voltage value VC(<VB<VA).

If the DC signals SAV detected in steps 11 (S11)–15(S15) are plotted with respect to the oscillation frequency of the scattered oscillation signal SSS, the same band distribution as the first embodiment (FIG.3) can be obtained. Detection for the edge frequency in band distribution by adjusting the predetermined voltage value VX of the comparator 25, recognition on the evenness of the DC signal SAV by adjusting the predetermined voltage value VX form the maximum voltage value VA into a range of the predetermined voltage width and the like are the same as the first embodiment (FIG. 3).

Although FIG. 5 indicates only the side of the low frequency relative to the fundamental frequency f0 like FIG. 3, needless to say, the high frequency side can be obtained.

Figure 6:
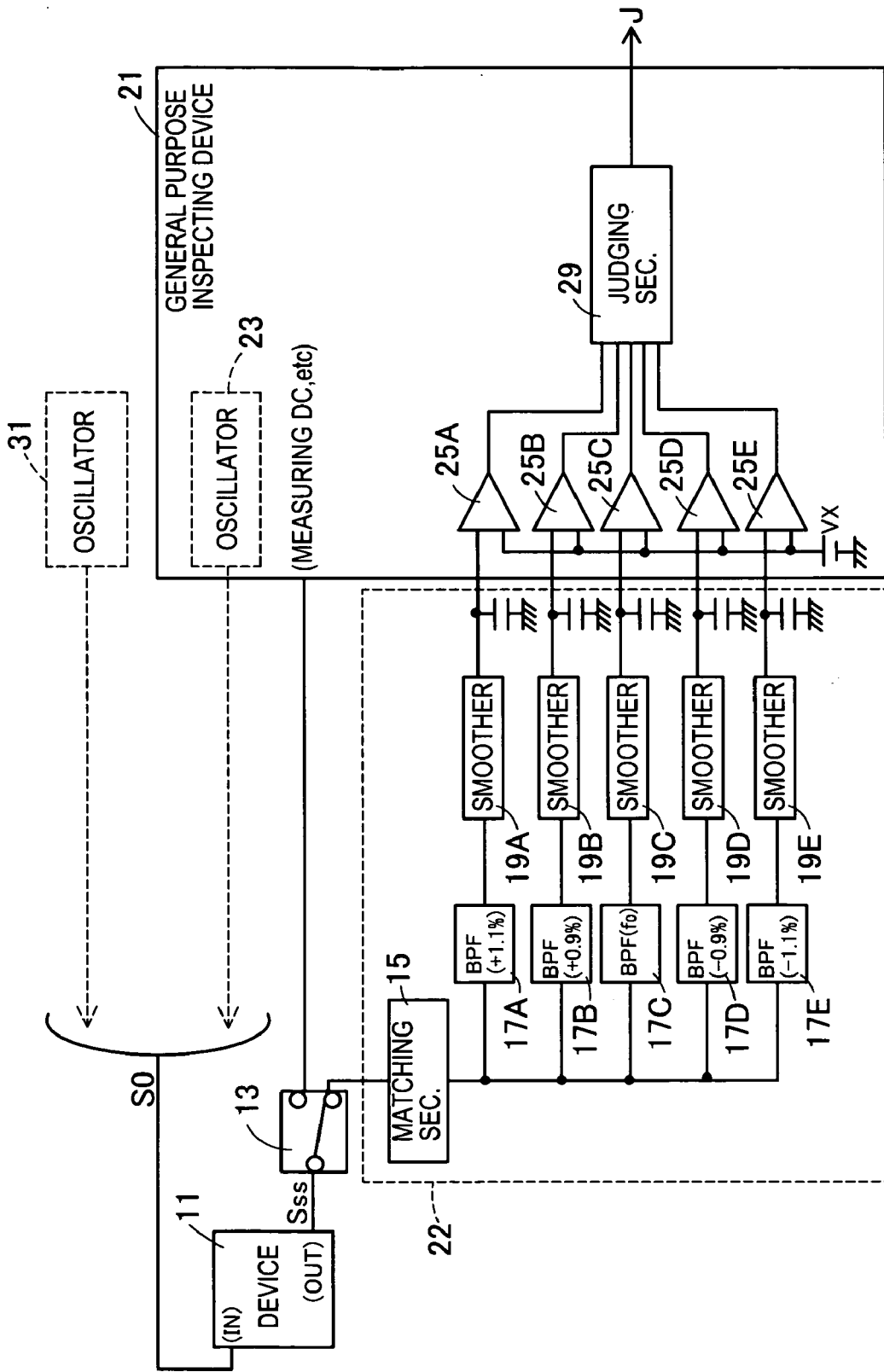
FIG. 6 is a circuit block diagram of a variant directed to the second embodiment.
Figure 7:
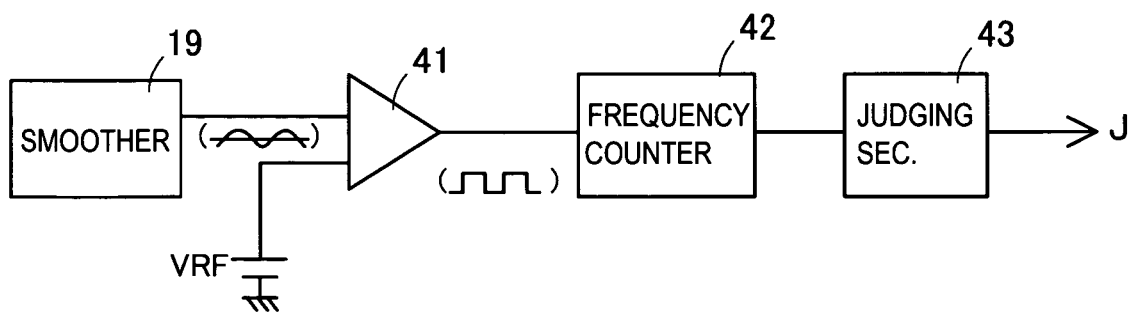
FIG. 7A is a circuit block diagram of main portions directed to a third embodiment, particularly in case cycle of RSM output is detected.
FIG. 7B is a circuit block diagram of main portions directed to a third embodiment, particularly in case duty of RSM output is detected.
Figure 7:
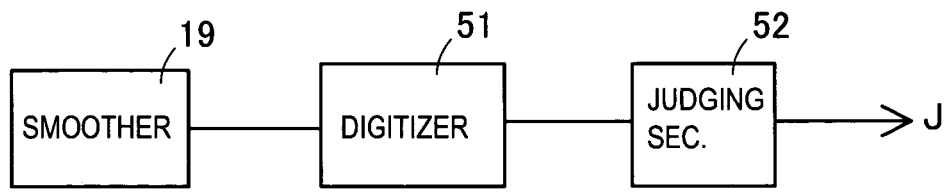

FIG. 6 shows a modification of the band distribution inspecting device according to the second embodiment. Instead of the switches ( . . . 12A–12E . . . ), ( . . . 14A–14E . . . ) of the second embodiment, the smoothers 19A–19E are provided on each of the band pass filters 17A–17E and a capacitor is provided on each output path.

The band pass filter 17B sets a frequency band 0.9% higher than the pass band (fundamental frequency f0) of the band pass filter 17C as a pass band. The band pass filter 17A sets a frequency band 1.1% higher than the band pass filter 17C as a pass band. Conversely, the band pass filter 17D sets a frequency band 0.9% lower than the pass band (fundamental frequency f0) of the band pass filter 17C as a pass band and the band pass filter 17E sets a frequency band 1.1% lower than the band pass filter 17C as a pass band. Consequently, the band distribution of a scattered oscillation signal SSS having ±1.0% band width can be detected.

In the second embodiment (FIG. 4), an example that band pass filters having different pass bands are selected successively by turning ON the switches in succession has been explained. The modification example (FIG. 6) indicates a case where signal detection of each pass band is carried out by parallel processing by providing each band pass filter with a smoother and a capacitor. The comparison processing with the predetermined voltage value VX can be carried out by the parallel processing if comparators 25A–25E for comparing DC signals outputted in parallel are provided in parallel.

FIG. 7A and FIG. 7B are block diagrams of major component circuit of the band distribution inspecting device of the third embodiment. In the example of FIG. 7A, the capacitor C1 provided on the band distribution inspecting device (FIG. 1) of the first embodiment is eliminated and a comparator 41 and a frequency counter 42 are provided instead. An output signal from the frequency counter 42 is judged by a judging section 43 so as to detect the period of the RMS output from the smoother 19.

In the example shown in FIG. 7B, the capacitor C1 provided on the band distribution inspecting device (FIG. 1) of the first embodiment is eliminated and a digitizer 51 is provided. An output signal from the digitizer 51 is judged by the judging section 52 and the duty of the RMS output from the smoother 19 is detected.

If the scattered oscillation signal SSS varies in frequency cyclically, the RMS output from the smoother 19 turns into a waveform containing a periodic swell of amplitude corresponding to the period of deflection. The period of the swell may be sometimes disturbed by the symmetry of the periodic waveform, periodic deflection, dullness or distortion of the waveform and the like.

In the case FIG. 7A, by setting the reference voltage VRF of the comparator 41 to the center voltage of the swell of the RMS output, the frequency of the swell which appears in the RMS output, disturbance of the frequency and the like can be detected. The deflection period of the scattered oscillation signal SSS when it varies in frequency within the band can be inspected and a disturbance in the waveform of the scattered oscillation signal SSS can be inspected.

In the case FIG. 7B, the waveform analysis on the RMS output containing the swell can be carried out accurately by the digitizer 51. The frequency of the swell, disturbance in the frequency, time rate of individual oscillation frequency in the scattered oscillation signal SSS and the like can be detected. The deflection period of the scattered oscillation signal SSS when it varies in frequency within the band can be inspected and a disturbance in the waveform of the scattered oscillation signal SSS can be inspected.

In this case, the digitizer 51 needs to acquire data at a predetermined sampling time interval corresponding to a resolution to be analyzed. The frequency of the swell of the RMS output is a frequency corresponding to the frequency variation of the scattered oscillation signal SSS and further, a slower frequency than the oscillation frequency of the scattered oscillation signal SSS. Thus, the sampling time interval can be extended more than a case of sampling the scattered oscillation signal SSS. The digitizer 51 is not demanded for high-speed operation performance and thus, a highly functional device having the high-speed performance does not need to be used.

FIG. 8 is a diagram showing an example of a module substrate in case where the band distribution detecting section 22 in the band distribution inspecting device (FIG. 1) of the first embodiment is constructed separately from the general purpose inspecting device 21 as a module substrate 61.

The module substrate 61 has band pass filters 17-1 to 17-3 each having a different pass band. Each of the band pass filters is selected by turning ON any relay of relays 62-1 to 62-3 and 64-1 to 64-3. The pass band filter is selected corresponding to the oscillation frequency band of the scattered oscillation signal SSS. The module substrate 61 includes three filters whose pass bands are 20 MHz, 50 MHz and 100 MHz and are selected according to the scattered oscillation signal SSS of the same frequency band.

In the module substrate 61, the scattered oscillation signal SSS is inputted through the IN terminal and the DC signal SAV is outputted from the OUT terminal. The RL0–RL4 terminals are control terminals for the relays. Of them, the RL2–RL4 terminals are control terminals for the relays 62-1 to 62-3 and 64-1 to 64-3. The RL0 terminal is a control terminal for the relay 63. The relay 63 is provided between the MON terminal and signal input path. When an inspecting device including the module substrate 61 is calibrated, input of a calibration signal not through the device 11 is enabled by inputting a signal through the MON terminal instead of a signal route from the IN terminal to which the inspecting device 11 (FIG. 1) is connected. The RL1 terminal is a control terminal for the relay 65. The signal route is connected to a T.ch terminal through the relay 65. This relay enables DC measurement of the device 11 connected to the IN terminal by connecting the T.ch terminal to the DC measuring system of the inspecting device.

Various kinds of devices on the module substrate 61 are supplied with power through the 5V terminal. Meanwhile, the module substrate 61 may be provided with a mount region for the matching section 15. Consequently, it is possible to correspond appropriately depending on whether or not the impedance matching is necessary by short-cutting between the input and output terminals in the region if the matching section 15 is not necessary.

The band distribution inspecting device of the first embodiment can be constructed by connecting the module substrate 61 to the general purpose inspecting device 21 (FIG.1).

If the signal amplitude from the band pass filter needs to be amplified appropriately, the RMS-DC circuit or logarithmic amplifier only has to be provided with an amplitude amplifying function. Further, it is permissible to provide the output side of the band pass filter with an amplitude amplifier (not shown) so as to input an output of the amplitude amplifier into the smoother 19.

As described in detail above, according to the band distribution inspecting device and band distribution inspecting method of the first embodiment, in the scattered oscillation signal SSS, the fundamental frequency fSS0 changes from f0 to f0+fS, f0+2fS, f0+3fS, f0+4fS while the expansion characteristic of the band distribution having a deflection width ΔfSS from the fundamental frequency fSS0 is maintained, the relative position of the band distribution of the scattered oscillation signal SSS to a fixed predetermined pass band or a fixed predetermined band position is changed. The signal strength is detected corresponding to the band pass signal of the predetermined pass band or the signal amplitude of the predetermined band signal at a predetermined band position and the signal strength of the predetermined pass band in band distribution of the scattered oscillation signal SSS or the predetermined band position can be inspected. By adjusting the frequency step for changing the fundamental frequency, a signal strength between the frequency steps in the band distribution can be detected.

According to the distribution inspecting device and band distribution inspecting method of the second embodiment, in the scattered oscillation signal SSS, band pass filters ( . . . 17A–17E . . . ) are selected in succession for each band position in the band distribution from the fundamental frequency f0 and the signal strength is detected corresponding to the band pass signal or the signal amplitude of the band signal, so that the signal strength in the band distribution of the scattered oscillation signal SSS can be detected. By adjusting the interval of the band position between the band pass filters or the frequency step fS, which is an interval of the band position in band selecting step, signal distribution between the frequency steps fS in the band distribution can be detected. Here, the successive selection of the band pass filters is carried out by selecting switches ( . . . 12A–12E . . . ), ( . . . 14A–14E . . . ). These switches are an example of the switch section.

According to the band distribution inspecting device and band distribution inspecting method according to a modification of the second embodiment, the detection of the signal strength can be carried out by parallel processing by selecting the band pass filters 17A–17E at the same time provided for each band position in the band distribution from the fundamental frequency f0.

According to this embodiment, when the band distribution of the scattered oscillation signal SSS is inspected, detailed data collection and data analysis necessary for using a spectrum analyzer or digitizer or the like is not necessary and the inspection is achieved only by detecting the band strength corresponding to the band pass signal in each frequency step or the signal amplitude of the band signal, so that the inspection time can be reduced.

According to the first and second embodiments and their modifications, the outputs of the smoothers 19, 19A–19E are provided with a capacitor, so that the RMS of the scattered oscillation signal SSS is converted to the DC signal SAV and averaged and the band strength can be detected easily by the general purpose inspecting device 21 on a following stage. Here, the capacitors provided on the smoothers 19, 19A–19E and their outputs are an example of the signal strength detector, the smoothers 19, 19A–19E are an example of the first smoother and the capacitor is an example of the second smoother.

According to the band distribution inspecting device and band distribution inspecting method of the third embodiment, the period of the frequency variation of the scattered oscillation signal SSS can be detected according to the frequency of the swell of the RMS output which is an output signal from the smoother 19 by providing with the frequency counter 42 which is an example of the frequency counter. Further a change in signal of the RMS output is analyzed by providing with the digitizer 51, which is an example of the frequency analyzer so that the characteristic of the frequency variation in the scattered oscillation signal SSS can be detected. The period of the frequency variation in the scattered oscillation signal SSS which varies in frequency, the symmetry of its deflection, distortion in waveform generated upon the deflection and the like are detected as the signal strength.

According to the first and second embodiments, the spectrum analyzer or digitizer is not necessary and the digitizer 51, which is needed in the third embodiment, is permitted to operate at a relatively low speed and a high-speed, high-precision spectrum analyzer and digitizer, which are needed if the fundamental frequency of the scattered oscillation signal SSS is at a high frequency, are not necessary. The oscillator section 23 or the oscillator 31, which oscillates the fundamental oscillation signal SO at a fundamental frequency f0 of high frequency, eliminates the necessity of a high-speed, high-precision function circuit. Although the oscillator 31 may be provided separately from the inspecting device 21 in order to allow the general purpose inspecting device 21 to be used and realize the fundamental frequency f0 of the high frequency, no additional device is needed and the added oscillator 31 does not need to exchange complicated signals with the inspecting device 21. Consequently, the inspecting device can be simplified and further inspecting cost can be suppressed.

Needless to say, the present invention is not restricted to the above described embodiments but may be improved or modified in various ways within a scope not departing from the gist of the present invention.

For example although an example for inspecting the band distribution of the scattered oscillation signal SSS, which is outputted from the device 11, spectrum-scattered and varies in frequency periodically, has been described for this embodiment, the present invention is not restricted to this example, but it is needless to say that irregular frequency variation such as a jitter attached to an oscillation signal can be inspected by the present invention.

In this embodiment, the example for inspecting the period of the frequency variation, disturbance in waveform in the frequency variation and the like by inspecting averaged signals by smoothing an output of the band-pass filter has been described. The present invention is not restricted to this example, but only by providing with the output of the band pass filter with a peak hold circuit, the maximum value of the signal amplitude in the pass band of signals outputted through the band pass filter can be detected. Consequently, the band distribution of the scattered oscillation signal SSS can be inspected.

According to the present invention, the inspection on whether or not the scattered oscillation signal oscillated containing the frequency variation from the fundamental frequency has a predetermined band distribution can be carried out in a short inspection time without any detailed data collection or data analysis. Further, upon the inspection, no complicated additional devices are needed but instead, the general purpose inspecting device is applicable for this purpose, thereby simplifying the inspecting device and reducing inspection cost. Consequently, the inspection on the scattering rate of the frequency of a clock signal obtained by deflecting the oscillation frequency periodically using spectrum scattering technology effective for EMI countermeasure and the inspection on the frequency variation such as a jitter attached to an oscillated signal can be carried out rapidly in a simple way and at a low cost.

What is claimed is:

1. A band distribution inspecting device for inspecting the band distribution of a scattered oscillation signal oscillated containing a frequency variation from the fundamental frequency with the fundamental frequency of the fundamental oscillation signal as a reference point, comprising:
   a band pass filter which the scattered oscillation signal is inputted to and has a predetermined pass band of a predetermined narrow-band width with respect to the band distribution; and
   a signal strength detector which receives a predetermined band pass signal outputted from the band pass filter and outputs a band strength signal corresponding to a signal amplitude; and
   an oscillator section for setting the fundamental frequency of the fundamental oscillation signal so that it is adjustable,
   wherein the band distribution is inspected according to a change in the position of band distribution shifted corresponding to the fundamental oscillation signal in which the fundamental frequency changes, with respect to the predetermined band pass signal.

2. The band distribution inspecting device according to claim 1 wherein the signal strength detector has an amplitude amplifier for amplifying a signal amplitude of a band pass signal.

3. The band distribution inspecting device according to claim 1 wherein the signal strength detector includes a first smoother for smoothing a band pass signal or an output signal from an amplitude amplifier in an oscillation frequency band of the scattered oscillation signal.

4. The band distribution inspecting device according to claim 1 wherein the signal strength detector includes a second smoother for smoothing a band pass signal according to the period of the frequency variation of the scattered oscillation signal.

5. The band distribution inspecting device according to claim 1 wherein the signal strength detector includes a peak value holding circuit for holding a peak value of a band pass signal.

6. A band distribution inspecting device for inspecting the band distribution of a scattered oscillation signal oscillated containing a frequency variation from the fundamental frequency as a reference point, comprising:
   plural band pass filters which include pass band of a predetermined narrow-band width for each band position in the band distribution and which the scattered oscillation signal is to be inputted;
   a signal strength detector which receives a band pass signal outputted from each of the band pass filters and outputs a band strength signal corresponding to the signal amplitude; and
   a switch section which selects a band pass filter from the plural band pass filters and sends a band pass signal of a pass band selected to the scattered oscillation signal to the signal strength detector,
   wherein the band distribution is inspected corresponding to a band pass signal from each of the band pass filters.

7. The band distribution inspecting device according to claim 6 wherein the signal strength detector has an amplitude amplifier for amplifying a signal amplitude of a band pass signal.

8. The band distribution inspecting device according to claim 6 wherein the signal strength detector includes a first smoother for smoothing a band pass signal in an oscillation frequency band of the scattered oscillation signal.

9. The band distribution inspecting device according to claim 3 wherein an output signal from the signal strength detector is inputted to a frequency counter or/and a frequency analyzer.

10. The band distribution inspecting device according to claim 6 wherein the signal strength detector includes a second smoother for smoothing a band pass signal according to the period of the frequency variation of the scattered oscillation signal.

11. The band distribution inspecting device according to claim 6 wherein the signal strength detector includes a peak value holding circuit for holding a peak value of a band pass signal.

12. A band distribution inspecting method for inspecting the band distribution of a scattered oscillation signal oscillated containing a frequency variation from the fundamental frequency with the fundamental frequency of the fundamental oscillation signal as a reference point, comprising:

a frequency setting step of changing the fundamental frequency of the fundamental oscillation signal successively; and every time the fundamental frequency is set in the frequency setting step, performing a predetermined band selecting step of selecting a predetermined band signal of a predetermined narrow-band width with respect to a band distribution at a predetermined band position in the scattered oscillation signal, and a signal strength detecting step of outputting a band strength signal corresponding to a signal amplitude of a selected predetermined band signal, so as to inspect the band distribution.

13. The band distribution inspecting method according to claim 12 wherein a band strength signal is outputted corresponding to a first smoothing signal obtained by smoothing a band signal in the oscillation frequency band of the scattered oscillation signal in the signal strength detecting step.

14. The band distribution inspecting method according to claim 13 further has a frequency variation characteristic inspecting step of measuring oscillation period or/and oscillation duty of a band strength signal.

15. The band distribution inspecting method according to claim 13 wherein, in the signal strength detecting step, a band strength signal is outputted corresponding to a band signal obtained by smoothing a first smoothing signal according to a period of the frequency variation of the scattered oscillation signal.

16. The band distribution inspecting method according to claim 12 wherein the signal strength detecting step includes a peak value holding step of holding a peak value of a band signal.

17. A band distribution inspecting method for inspecting the band distribution of a scattered oscillation signal oscillated containing a frequency variation from the fundamental frequency as a reference point, comprising:

a band selecting step of selecting a band signal of a predetermined narrow-band width successively for each band position with respect to a band distribution of the scattered oscillation signal; and a signal strength detecting step of outputting a band strength signal corresponding to a signal amplitude of the band signal for each selected band signal, so as to inspect the band distribution.

18. The band distribution inspecting method according to claim 17 wherein a band strength signal is outputted corresponding to a first smoothing signal obtained by smoothing a band signal in the oscillation frequency band of the scattered oscillation signal in the signal strength detecting step.

19. The band distribution inspecting method according to claim 18 wherein, in the signal strength detecting step, a band strength signal is outputted corresponding to a band signal obtained by smoothing a first smoothing signal according to a period of the frequency variation of the scattered oscillation signal.

20. The band distribution inspecting method according to claim 17 wherein the signal strength detecting step includes a peak value holding step of holding a peak value of a band signal.

* * * * *